United States Patent
Gorenz, Jr. et al.

(10) Patent No.: US 6,173,883 B1
(45) Date of Patent: Jan. 16, 2001

(54) METHOD AND APPARATUS FOR INCREASING HEAT TRANSFER THAT IS RESTRICTED IN THERMALLY ISOLATED POCKETS OF A MEDIUM

(75) Inventors: Harold Joseph Gorenz, Jr., Lisle; Patrick David Smith, Deerfield; Jeffrey P. Hasler, Schaumburg, all of IL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/193,661

(22) Filed: Nov. 17, 1998

(51) Int. Cl.[7] .................................................. B23K 31/00
(52) U.S. Cl. ........................................ 228/179.1; 228/222
(58) Field of Search ............................ 228/179.1, 180.1, 228/180.21, 183, 212, 213, 222

(56) References Cited

U.S. PATENT DOCUMENTS

| | | | |
|---|---|---|---|
| 5,175,612 | * 12/1992 | Long et al. | 257/667 |
| 5,311,395 | * 5/1994 | McGaha et al. | 361/720 |
| 5,347,091 | * 9/1994 | Schroeder | 174/262 |
| 5,363,280 | * 11/1994 | Chobot et al. | 361/794 |
| 5,473,813 | * 12/1995 | Chobot et al. | 29/837 |
| 5,610,442 | * 3/1997 | Schneider et al. | 257/787 |
| 5,743,004 | * 4/1998 | Chobot et al. | 29/830 |
| 5,779,134 | * 7/1998 | Watson et al. | 228/179.1 |
| 5,913,108 | * 6/1999 | Stephens et al. | 438/109 |
| 5,917,700 | * 7/1999 | Clemens et al. | 361/704 |

* cited by examiner

Primary Examiner—Patrick Ryan
Assistant Examiner—Kiley Stoner
(74) Attorney, Agent, or Firm—Terri S. Hughes; Romi N. Bose

(57) ABSTRACT

A thermal mass (18) is reflow soldered atop of a multi-layered medium (10) in order to yield minimum thermal resistance between a heat source (22) located on the multi-layered medium (10) and the thermal mass (18) for greater heat dissipation efficiency. Moreover, the thermal mass (18) can be auto-placed onto the multi-layered medium (10) in order to accurately and closely position the thermal mass (18) next to the heat source (22).

7 Claims, 3 Drawing Sheets

METHOD AND APPARATUS FOR INCREASING HEAT TRANSFER THAT IS RESTRICTED IN THERMALLY ISOLATED POCKETS OF A MEDIUM

FIELD OF THE INVENTION

The present invention relates generally to a method and apparatus for increasing heat transfer that is restricted in thermally isolated pockets of a medium.

BACKGROUND OF THE INVENTION

In a printed circuit board (hereinafter referred to as "PCB"), a multitude of electrical conduction planes may exist. These electrical conduction planes allow connection of wiring about their specific planes.

The PCB electrically conductive planes are isolated by means of an insulate dielectric material. As a result of electrically isolating each conductive plane, the electrical planes are thermally isolated as well. Such a configuration allows heat transfer to be restricted in the inner layers of the PCB.

As a result of the restricted transfer of heat in the inner PCB layers, individual electrical components placed on the PCB can be expected to have higher heat concentrations in the inner and outer layers of the PCB about their physical space and therefore a subsequent decrease in their life and reliability is likely.

Thus, there exists a need to provide a means to remove heat from ground layers and into the chassis' airflow effectively without compromising PCB real estate or increasing cost and time to create customized heat sinks.

BRIEF DESCRIPTION OF THE DRAWINGS

A preferred embodiment of the invention is now described, by way of example only, with reference to the accompanying drawings in which.

DETAILED DESCRIPTION OF THE PREFERRED EMBODIMENT

The present invention provides a means to remove heat from ground layers and into a chassis' airflow effectively without compromising real estate on a printed circuit board (hereinafter referred to as "PCB") or increasing cost and time to create customized heat sinks. It should be noted that even though the following description refers to multi-layer PCBs, the present invention is also applicable to single layer PCBs as well. The present invention increases heat transfer that is restricted in thermally isolated pockets of a PCB. The present invention enables customized heat transfer using a universal part over an entire product line.

Figure 1:
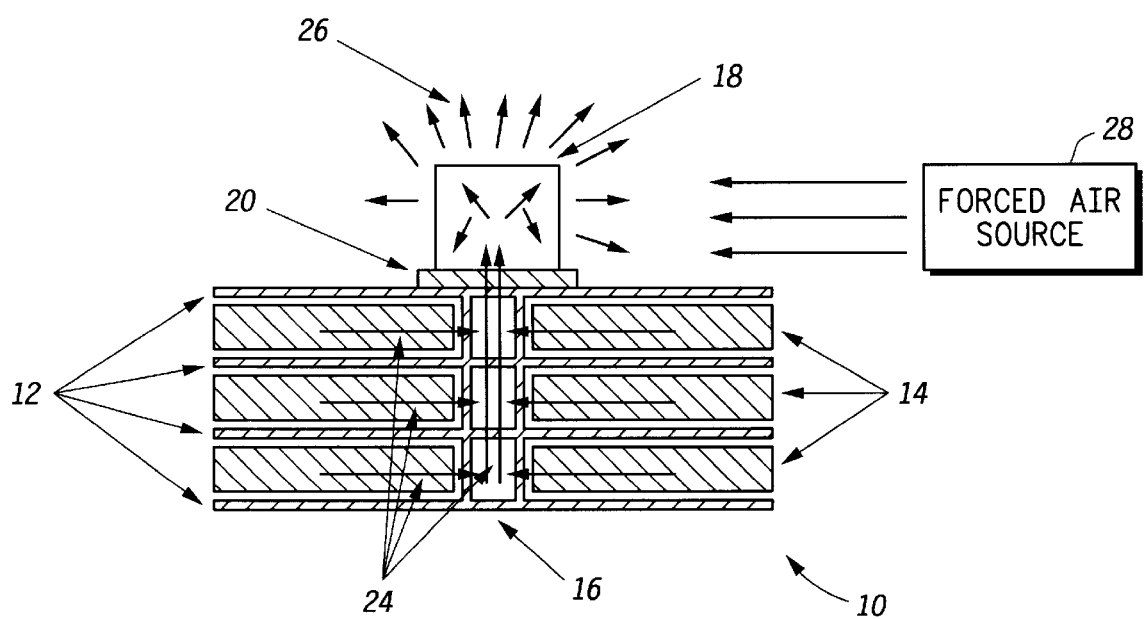
FIG. 1 is a cross-section of a multi-layered printed circuit board in accordance with the preferred embodiment of the present invention.

FIG. 1 illustrates a cross-sectional schematic of a multi-layered PCB 10. The multi-layered PCB 10 comprises PCB electrical ground planes/connections 12 made of a conductive material, such as copper, a PCB dielectric 14 made of insulative material and a via 16 that connects different conductor connections on different layers of the PCB 10. To physically connect electrical connections that may reside on different PCB electrical planes/connections 12, the via 16 is used to selectively electrically tie the PCB electrical planes 12 together. In general, the via 16 is a drilled hole through the PCB 10 that is coated with an electrically conductive material. Each via 16 can be defined as a signal connection or a ground connection on the PCB 10.

Figure 2:
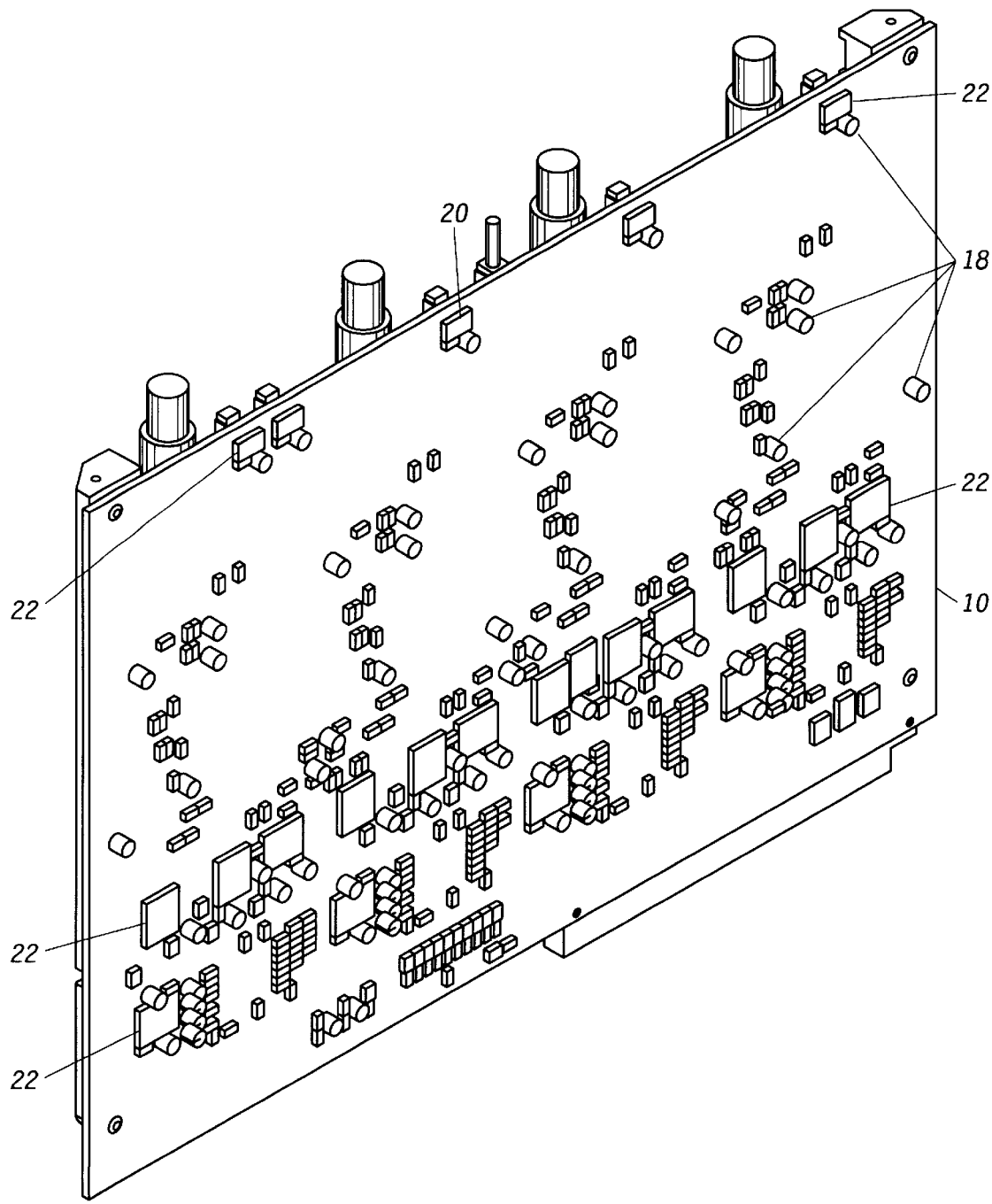
FIG. 2 is an illustration of alternative patterns for a thermal mass in accordance with the preferred embodiment of the present invention.

In accordance with the preferred embodiment of the present invention, a thermal mass 18 is reflow soldered 20 directly to a ground plane 12 of the PCB 10 with no or minimum change to the existing layout of the components 22 (as shown in FIG. 2). The thermal mass 18 is placed on the surface of a conductive track or via 16 of the PCB 10 using a surface mounting placement machine and adheres thereto by adhesive solder paste. The thermal mass 18 is then reflow soldered onto the PCB 10. The thermal mass 18 is made out of any thermally conductive material (preferably metallic) that can be reflow soldered 20 onto the PCB 10 (e.g., copper, bronze, nickel-silver, silver, etc.). The thermal mass 18 is preferably monolithic, however, the thermal mass 18 does not necessarily need to be uniform or homogenous in form. Thermal masses 18 greatly reduce thermal resistance by increasing surface area for convection and radiation cooling. Heat 24 is extracted directly from the inner layers of the PCB 10 into the thermal mass 18 and dissipated into the atmosphere by way of radiation 26 more efficiently using the additional surface area of the thermal mass 18 that is intimately reflow soldered 20 to the ground plane 12 of the PCB 10.

Preferably, the thermal mass 18 has at least one dimensional feature that is substantially equal to a corresponding dimensional feature of the interface to the conductor connection on which it sits. The conductor connection could be a via or a track on the PCB 10 or any other conductor connection suitable for reflow soldering a thermal mass 18 thereto. The at least one dimension is preferably measured parallel to the plane of the PCB 10. Preferably, the height of the thermal mass 18 (i.e., its dimension perpendicular to the plane of the PCB 10) is approximately equal to or significantly greater than its width. The volume of the thermal mass 18, however, cannot be so great that it will not reach an adequate temperature during reflow soldering to reflow the solder paste for a good bond of the thermal mass 18 to the PCB 10.

In addition, with the thermal mass 18 increasing the radiating surface area of the PCB 10, airflow from a forced air source 28 (e.g., a fan) can increase the heat transfer from the PCB 10 by forced convection.

Preferably, the thermal mass 18 is reflow soldered 20 atop of existing via geometry 16. Reflow soldering 20 the thermal mass 18 atop of existing via geometry 16 allows for the best conductive connection because it allows heat 24 to be extracted from as many isolated areas as possible. The removal of heat 24 from the inner dielectically isolated PCB layers 14 is achieved by reflow soldering 20 the thermal mass 18 onto the electrically and thermally conductive surface 12 that is electrically connected to a via 16. By reflow soldering 20 the thermal mass 18 atop of an electrically and thermally conductive surface 12 that is electrically connected to a via 16, heat 24 is transferred to the thermal mass 18 from the top layer 12 and all other layers 12 within the PCB 10 in which the via 16 contacts and dissipated away from the PCB 10 and associated electrical components 22 by way of radiation and convection 26. Thus, it is also preferable to reflow solder 20 the thermal mass 18 as close as possible to a component 22 that is generating heat 24 in order to extract a greater amount of heat 24 from the PCB 10. The increase in heat dissipation enables components 22 to operate at a cooler temperature which increases the components' efficiency and reliability.

Thermal masses 18 can also be reflow soldered over non-via connected ground planes of the PCB 10 to increase heat flow across a plane, reduce a plane's thermal resistance, cool the PCB 10 and increase reliability of the components by their additional thermal mass by means of the addition of surface area for convection and radiation that is intimately connected to the plane. If, however, a thermal mass 18 is reflow soldered atop of a ground plane where there is not a via 16, the thermal mass 18 essentially only extracts heat out of the top ground layer because there is no path provided to extract heat from the inner layers of the PCB 10.

FIG. 2 illustrates locations of some of the thermal masses 18 on the backside of the PCB 10. As shown, the thermal masses 18 are reflow soldered as close as possible to the components that are generating heat in order to extract the maximum amount of heat from the PCB 10. Although FIG. 2 illustrates the thermal masses 18 reflow soldered onto the backside of the PCB 10, the thermal masses 18 could alternatively be reflow soldered onto the frontside of the PCB 10. The present invention is most efficient in the presence of forced air flow. Thus, the thermal masses 18 is ideally reflow soldered to the side of the PCB 10 where the air flow is prominent. For greatest efficiency of heat dissipation from the PCB 10, the thermal masses 18 should be reflow soldered onto the front and backside of the PCB 10.

Figure 3:
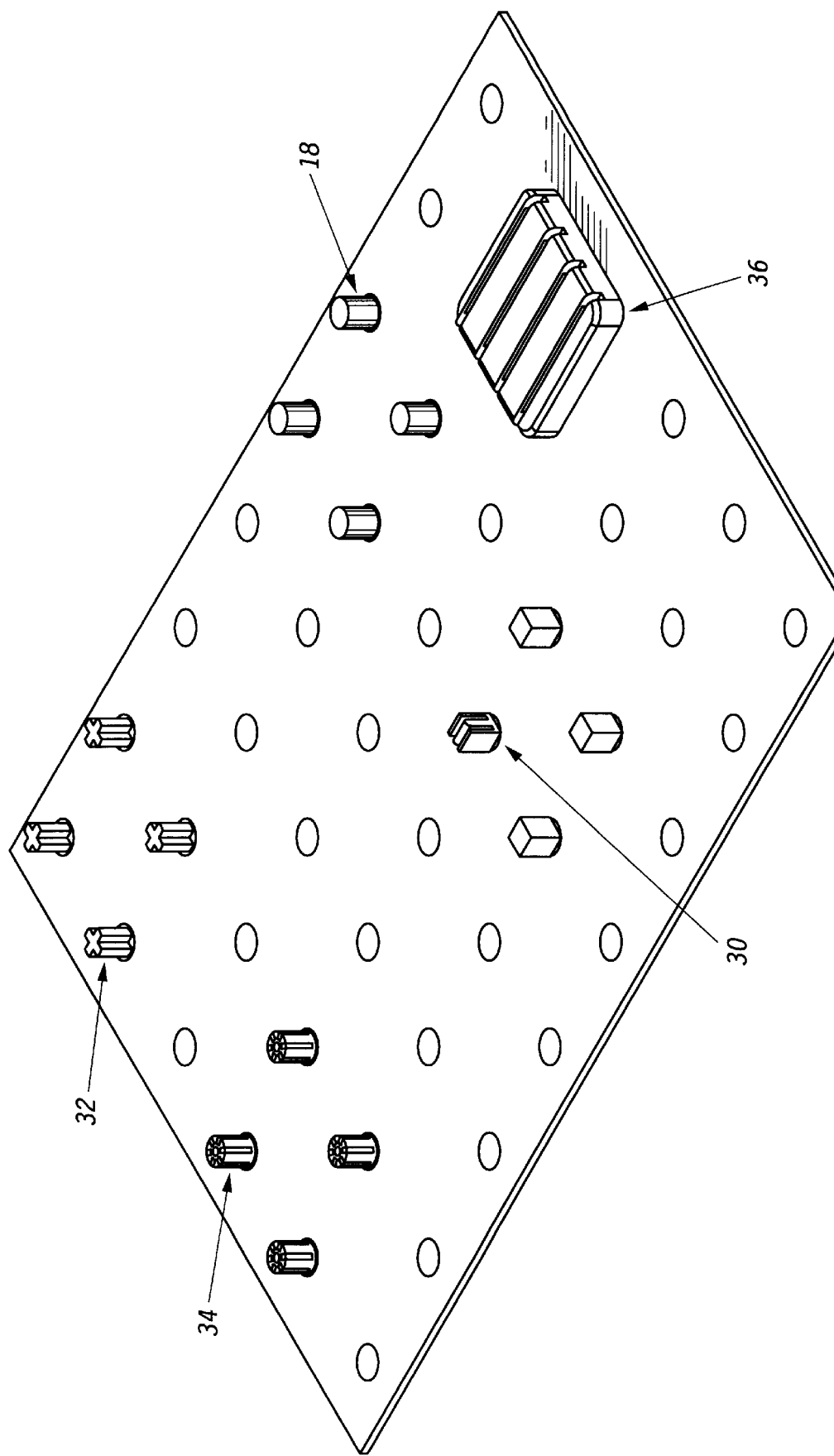
FIG. 3 is a backside view of a printed circuit board illustrating locations of some of the thermal masses in accordance with the preferred embodiment of the present invention.

The radiated and convective efficiency of the thermal masses can further be increased by using "finned" designs as shown in FIG. 3. A thermally conductive thermal fin reflow soldered on the PCB 10 increases the surface area of the thermal mass 18, thus allowing a greater amount of heat to escape from the PCB 10. The number of thermal fins used per component or PCB 10 is dependent on the amount of heat that needs to be extracted from the PCB 10. The fins are preferably cut out of the thermal mass 18 along its perpendicular dimension relative to the thermal mass 18 PCB 10 placement orientation, but could alternatively be cut out of its parallel dimension as well.

The size and shape of the thermal fins is adjusted per PCB 10 requirements. Preferably, the thermal mass 18 is cylindrical shaped with a 0.060 inch diameter. The thermal mass 18, however, is not limited to any particular design and can be configured to take on the shape of any number of different patterns 30, 32, 34 as shown in FIG. 3. Moreover, the thermal mass 18 can be configured as an enclosure type 36 in order to cool an entire component group.

The shape and size of the thermal mass 18 can also be optimized for duty cycle or steady state conditions and radiant, conduction and convection heat transfer by maximizing thermal mass or maximizing surface area. The height of the thermal mass 18 is dependent on the PCB 10 housing height and assembly stability. Taller fins increase thermal mass and area. The width or diameter of the thermal mass is dependent on the via geometry 16. The shape of the thermal mass should maximize heat transfer while remaining within the PCB 10 design and housing constraints. Thus, since the thermal mass 18 is designed to fit over existing via geometry 16, there is minimum or no impact with respect to original design schedules as well as PCB redesign schedules. Components and traces can be changed without the necessity of designing around or making room for the thermal mass 18.

In addition to the thermal mass 18 being reflow soldered onto the PCB 10 just as any other component on the PCB 10, the configuration of the present invention allows the thermal masses 18 to also be auto-placed onto the PCB 10. Thus, unlike typical heat sinks, the thermal mass 18 is treated as another component auto-placed and reflow soldered onto the PCB 10. Auto-placement and reflowability provides greater manufacturing efficiency because the need for manual operations which are less reliable, more time consuming and expensive is eliminated. Auto-placement allows for accurate and close positioning of the thermal mass 18 to the heat source (e.g., the components), and reflowability yields virtually no thermal resistance between the component(s) and the thermal mass 18.

While the invention has been described in conjunction with a specific embodiment thereof, additional advantages and modifications will readily occur to those skilled in the art. For example, the present inventions applicable to any multi-layer medium connected by a top surface medium which is made of a conductive material to which the thermal mass 18 can be reflow soldered. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

We claim:

1. A method for increasing heat transfer that is restricted in thermally isolated pockets of a multilayered medium, wherein the layers are coupled and the medium has one or more heat generating components installed thereon, the method comprising reflow soldering closely adjacent to the heat generating component a thermal mass onto an electrically and thermally conductive surface atop of the multilayered medium in order to yield minimum thermal resistance between the heat generating component located on the multilayered medium and the thermal mass and to dissipate heat away from the heat generating component and the multiple layers of the medium, the heat dissipation occurring through radiation and convection.

2. The method according to claim 1 wherein the thermal mass is reflow soldered directly atop of a via.

3. The method according to claim 1 wherein the thermal mass is reflow soldered atop of a ground plane.

4. The method according to claim 1 wherein the multilayered medium is a printed circuit board.

5. The method according to claim 1 wherein a height of the thermal mass is significantly greater than its width.

6. The method according to claim 1 wherein the thermal mass has at least one dimension that is substantially equal to a dimension of an interface to a conductor connection on which it sits.

7. The method according to claim 6 wherein the at least one dimension is measured parallel to a plane of the multilayered medium.

* * * * *